United States Patent
Shen et al.

(10) Patent No.: US 11,171,237 B2
(45) Date of Patent: Nov. 9, 2021

(54) MIDDLE OF LINE GATE STRUCTURES

(71) Applicant: GLOBALFOUNDRIES U.S. INC., Santa Clara, CA (US)

(72) Inventors: Yanping Shen, Saratoga Springs, NY (US); Haiting Wang, Clifton Park, NY (US); Hui Zang, Guilderland, NY (US); Jiehui Shu, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 114 days.

(21) Appl. No.: 16/386,902

(22) Filed: Apr. 17, 2019

(65) Prior Publication Data

US 2020/0335619 A1  Oct. 22, 2020

(51) Int. Cl.
| | |
|---|---|
| *H01L 23/482* | (2006.01) |
| *H01L 29/78* | (2006.01) |
| *H01L 21/8238* | (2006.01) |
| *H01L 29/66* | (2006.01) |
| *H01L 21/8234* | (2006.01) |

(52) U.S. Cl.
CPC .... *H01L 29/785* (2013.01); *H01L 21/823437* (2013.01); *H01L 21/823821* (2013.01); *H01L 29/66545* (2013.01); *H01L 29/66795* (2013.01)

(58) Field of Classification Search
CPC ..... H01L 21/823431; H01L 21/823821; H01L 21/845
See application file for complete search history.

(56) References Cited

U.S. PATENT DOCUMENTS

| | | |
|---|---|---|
| 8,080,838 B2 | 12/2011 | Chang et al. |
| 8,975,141 B2 | 3/2015 | Wei et al. |
| 2014/0038402 A1* | 2/2014 | Wei ................. H01L 29/7843 438/589 |
| 2014/0273365 A1 | 9/2014 | Wei et al. |
| 2015/0364534 A1* | 12/2015 | Nowak ................. H01L 28/60 257/300 |
| 2019/0109570 A1* | 4/2019 | Vedula ................. H01L 27/092 |

* cited by examiner

*Primary Examiner* — Moazzam Hossain
*Assistant Examiner* — Hajar Kolahdouzan
(74) *Attorney, Agent, or Firm* — Francois Pagette; Andrew M Calderon; Roberts Calderon Safran & Cole, P.C.

(57) ABSTRACT

The present disclosure generally relates to semiconductor structures and, more particularly, to middle of line gate structures and methods of manufacture. The structure includes: a plurality of adjacent gate structures; a bridged gate structure composed of a plurality of the adjacent gate structures; source and drain regions adjacent to the bridged gate structure and comprising source and drain metallization features; and contacts to the bridged gate structure and the source and drain metallization features.

19 Claims, 10 Drawing Sheets

MIDDLE OF LINE GATE STRUCTURES

FIELD OF THE INVENTION

The present disclosure generally relates to semiconductor structures and, more particularly, to middle of line gate structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate middle of line (MOL) metallization features, e.g., interconnects, due to the critical dimension (CD) scaling and process capabilities, as well as materials that are used to fabricate such structures.

For example, in finFET technologies, gate contacts can connect adjacent gate structures with respect to one another. However, these gate contacts require a relatively minimal size due to a lack of real estate. Further, fabrication of these gate contacts requires a relatively limited process margin and inline process control in order to prevent shorting between the gate contacts and source and drain metallization features. Additionally, the size and shape of these source and drain metallization features are limited by current MOL structures.

SUMMARY

In an aspect of the disclosure, a structure comprises: a plurality of adjacent gate structures; a bridged gate structure composed of a plurality of the adjacent gate structures; source and drain regions adjacent to the bridged gate structure and comprising source and drain metallization features; and contacts to the bridged gate structure and the source and drain metallization features.

In an aspect of the disclosure, a structure comprises: a plurality of gate structures comprising source/drain regions, gate materials, sidewall spacers and a capping material on the gate materials; a bridge structure spanning between two or more gate structures of the plurality of gate structures; a plurality of source and drain metallization features in electrical contact with the source/drain regions; and a contact on the bridge structure.

In an aspect of the disclosure, a method comprises: forming a plurality of gate structures; bridging the gate structures to form a bridged gate structure; and forming a contact to the bridged gate structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to middle of line gate structures and methods of manufacture. In embodiments, the processes and structures provided herein allow for the formation of a bridged gate structure by bridging together adjacent gate structures. Advantageously, the bridged gate structure allows for a relatively significant reduction in gate contact sizing. Accordingly, a middle of line (MOL) multi-finger (multi-fin) device with a single gate contact can be achieved.

The reduced gate contact of the bridged gate structure allows for scaling in MOL structures and also for enlargement of an MOL process margin. Additionally, the reduced gate contact allows for adjacent source and drain (S/D) metallization features to have greater flexibility with respect to sizes, shapes and placement, e.g., a single S/D metallization feature spanning the fin structures. This flexibility with respect to the S/D metallization features allows for a reduction in process steps and materials, i.e., less patterning steps, along with an increase in the process margin because of the elimination of a risk for shorting between the gate contact and the S/D metallization features provided by the bridged gate structure.

The structures and processes described herein provide for a method to form a bridged gate structure having a reduced gate contact. In embodiments, the method includes: a relatively narrow gate hard mask; a relatively wide gate hard mask; a gate connect hard mask; patterning of the hardmasks; dummy gate formation; replacement gate formation; and formation of contacts to bridged gate structures. In further embodiments, the structures and processes described herein allow for a bridged gate structure to have a reduced gate contact area. The bridged gate structure includes the following features: an "H" shaped bridged gate structure; a relatively smaller gate contact; and optimized source and drain metallization features, amongst other features.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1A:
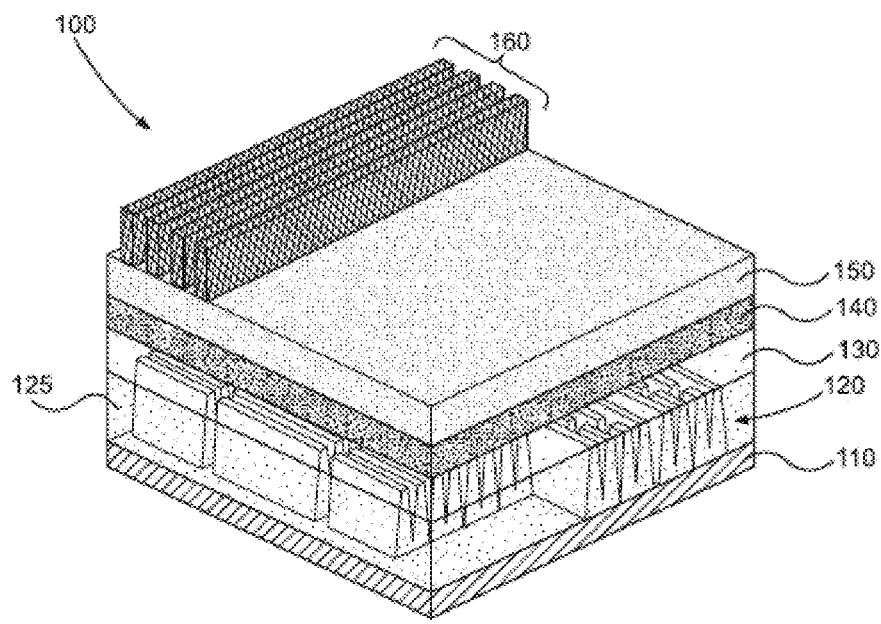
FIGS. 1A-1E show the formation of dummy gate structures, amongst other features, and respective fabrication processes in accordance with aspects of the present disclosure.

FIGS. 1A-1E show an incoming structure and respective fabrication processes in accordance with aspects of the present disclosure. More specifically, FIG. 1A shows a structure 100 comprising a substrate 110 composed of a suitable semiconductor material. For example, the substrate 110 may be composed of any suitable material including, but not limited to, Si, SiGe, SiGeC, SiC, GaAs, InAs, InP, etc. In embodiments, the substrate 110 is used to form fin structures 120.

In embodiments, the fin structures 120 can be fabricated using a sidewall image transfer (SIT) technique. In an example of a SIT technique, a mandrel material, e.g., $SiO_2$, is deposited on the substrate 110 using conventional chemical vapor deposition (CVD) processes. A resist is formed on the mandrel material, and exposed to light to form a pattern (openings). A reactive ion etching (RIE) is performed through the openings to form the mandrels. In embodiments, the mandrels can have different widths and/or spacing depending on the desired dimensions of the fin structures 120. Spacers are formed on the sidewalls of the mandrels which are preferably material that is different than the mandrels, and which are formed using conventional deposition processes known to those of skill in the art. The spacers can have a width which matches the dimensions of the fin structures 120, for example. The mandrels are removed or stripped using a conventional etching process, selective to the mandrel material. An etching is then performed within the spacing of the spacers to form the sub-lithographic features. The sidewall spacers can then be stripped.

An insulator material 125 is deposited on and over the fin structures 120 by a CVD process. A poly Si material 130 is deposited over the substrate 110 and the fin structures 120. In embodiments, the poly Si material 130 can be deposited by CVD processes, followed by a conventional chemical mechanical polishing (CMP) process. A capping layer 140 is deposited on the poly Si material 130. In embodiments, the capping layer 140 can be a nitride material, e.g., SiN, deposited by CVD processes.

A hardmask material 150 is formed on the capping layer 140. In embodiments, the hardmask material 150 can be a material which has a different patterning selectivity to the poly Si material 130 and the capping layer 140. The hardmask material 150 is deposited by CVD processes. A patterned hardmask structure 160 is formed on the hardmask material 150. In embodiments, the patterned hardmask structure 160 can be formed by a sidewall-assisted double patterning (SADP) process as is known to those of skill in the art such that no further explanation is needed. The patterned hardmask structure 160 can be comprised of a material having a different selectivity compared to the poly Si material 130, the capping layer 140 and the hardmask material 150. As shown, the patterned hardmask structure 160 is patterned into strips on a single side of the structure 100.

Figure 1B:
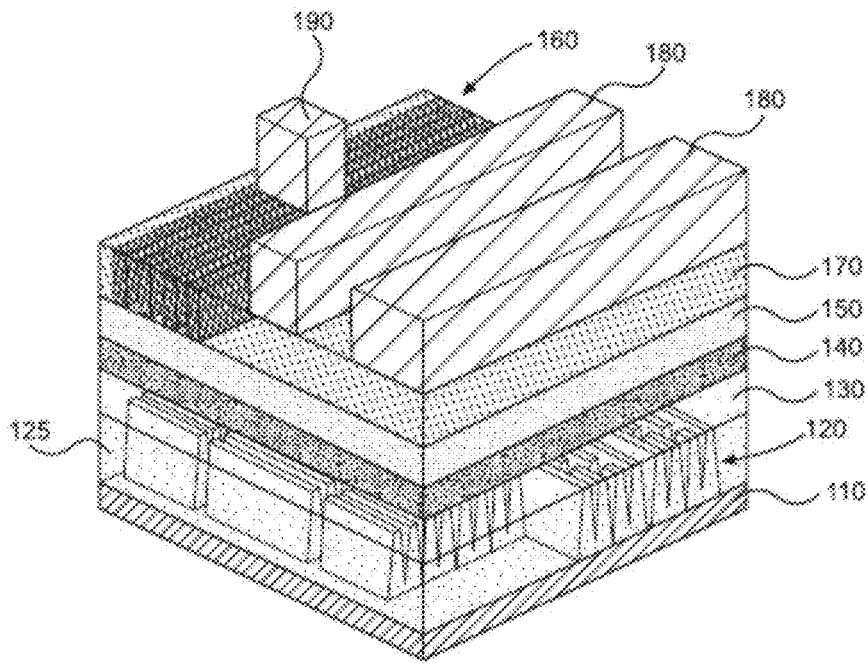

FIG. 1B shows an oxide layer 170 on the patterned hardmask structure 160 and over the hardmask material 150. The oxide layer 170 can be composed of SOH, amongst other examples, and is deposited by any conventional deposition processes, e.g., CVD processes. Patterned hardmasks 180, 190 are formed on the oxide layer 170 and are comprised of a nitride material, e.g., SiN. In embodiments, the patterned hardmask 190 is used to pattern a hardmask for a local gate connection between adjacent gate structures formed using the patterned hardmask structure 160; whereas patterned hardmask 180 allows for separate gate structures to be formed. The patterned hardmasks 180, 190 are patterned using conventional lithography and etching processes known to those of ordinary skill in the art such that no further explanation is required for a complete understanding of the disclosure.

Figure 1C:
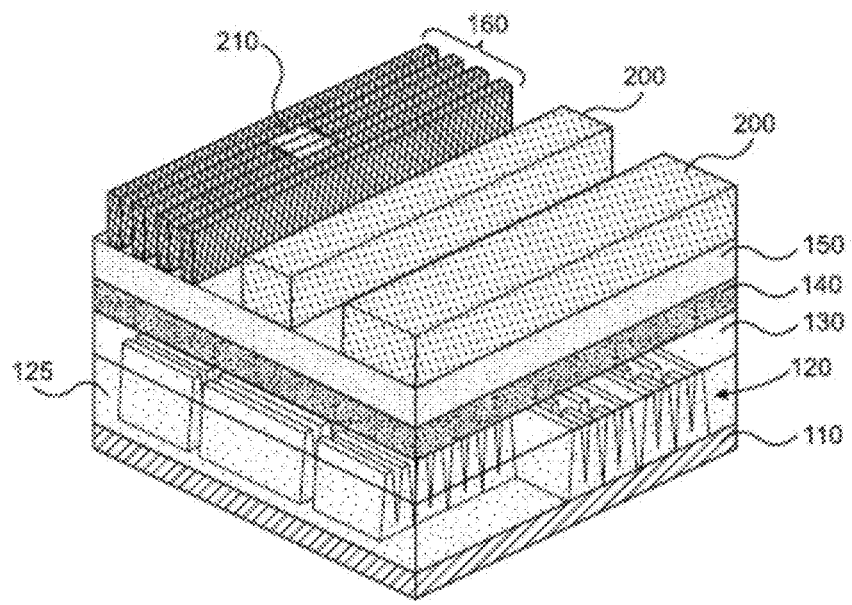

In FIG. 1C, an etching process with a selective chemistry, e.g., a RIE process will be used along with the patterned hardmask structures 180, 190 to form the patterned hardmask structures 200, 210. The patterned hardmask structures 200 are patterned on the underlying hardmask material 150, with patterned hardmask 210 spanning between adjacent patterned hardmask structures 160. The patterned hardmask structures 180, 190 can be stripped by conventional stripping processes.

Figure 1D:
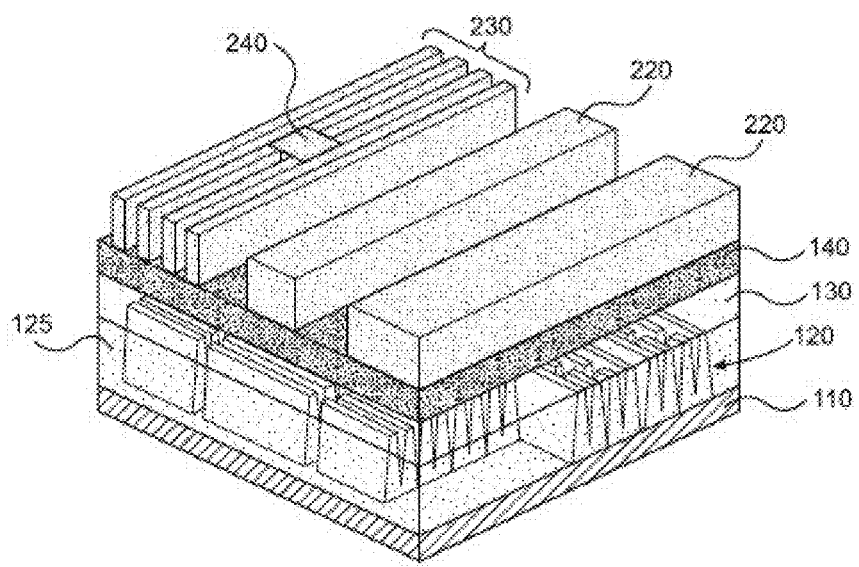

In FIG. 1D, a further etching process with a selective chemistry, e.g., RIE process, will be used with the patterned hardmask structures 160, 200, 210 to form the patterned hardmask structures 220, 230, 240. The patterned hardmask structure 240 is between adjacent patterned hardmask structures 230. The structures 160, 200, 210 can be stripped by conventional stripping processes.

Figure 1E:
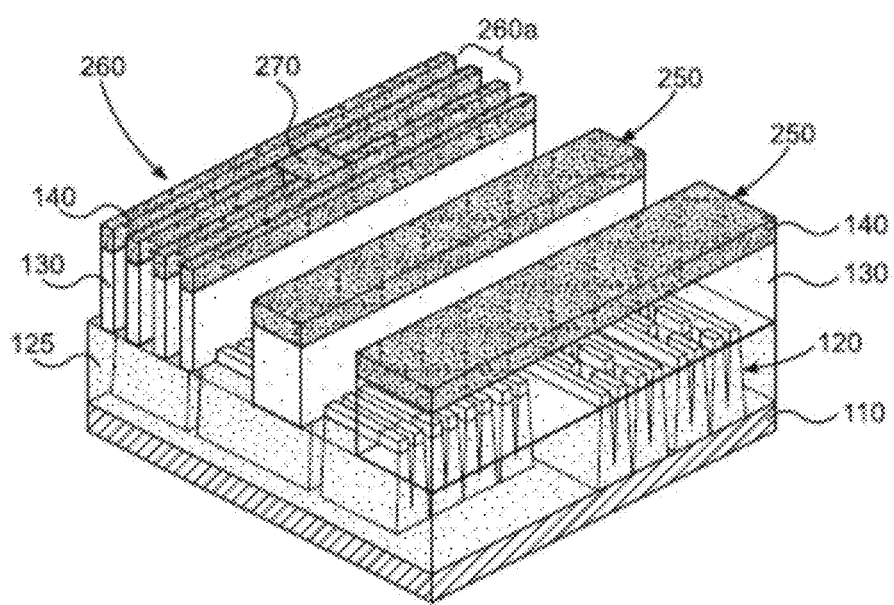

FIG. 1E shows the formation of dummy gate structures 250, 260, and particularly bridged dummy gate structure 260a formed from the dummy gate structures 260. The dummy gate structures 250, 260 are formed using a RIE process which is selective to the poly Si material 130 and the capping layer 140. In embodiments, the hardmask structure 240 forms a local dummy gate connection (bridged) 270, which connects adjacent gate structures of the dummy gate structures 260; that is, select dummy gate structures 260 are cladded or bridged together by the dummy gate connection 270 to form the bridged dummy gate structure 260a.

In embodiments, the bridged dummy gate structure 260a can be an "H" shaped gate structure; however, other shapes are contemplated herein depending on the shape, size and/or position of the dummy gate connection 270, e.g., a "U" shaped bridged gate structure, amongst other examples. In embodiments, the bridged dummy gate structure 260a can comprise at least two dummy gate structures 260 bridged (cladded) together; however, any number of dummy gate structures 260 can be bridged together to form the bridged dummy gate structure 260a.

As further shown in FIG. 1E, the dummy gate structures 250 are relatively wider than the dummy gate structures 260. For example, the dummy gate structures 260 can have a width in a range of about 5 nm to 40 nm, while the dummy gate structures 250 can have a width in a range of about 80 nm to 250 nm. In embodiments, it is also contemplated that the dummy gate structures 260 may be wider than the dummy gate structures 250, or that the dummy gate structures 250, 260 may have the same width. As shown in FIG. 1E, the fin structures 120 partially extend through a top surface of the insulator material 125. In this way, the fin structures 120 are partially exposed.

Figure 2A:
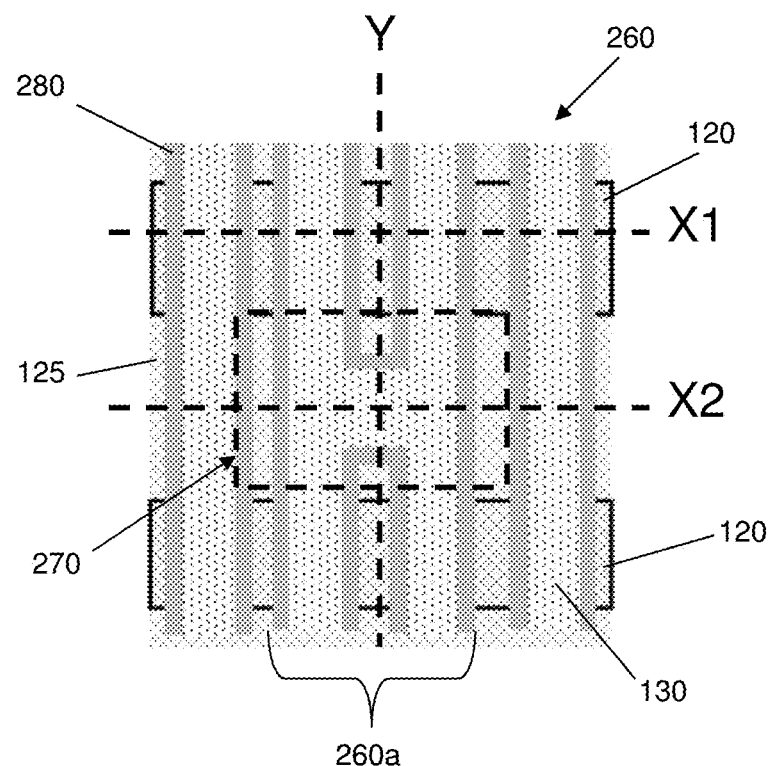
FIGS. 2A-2D show cross-sectional views of the dummy gate structures, amongst other features, and respective fabrication processes in accordance with aspects of the present disclosure.
Figure 2B:
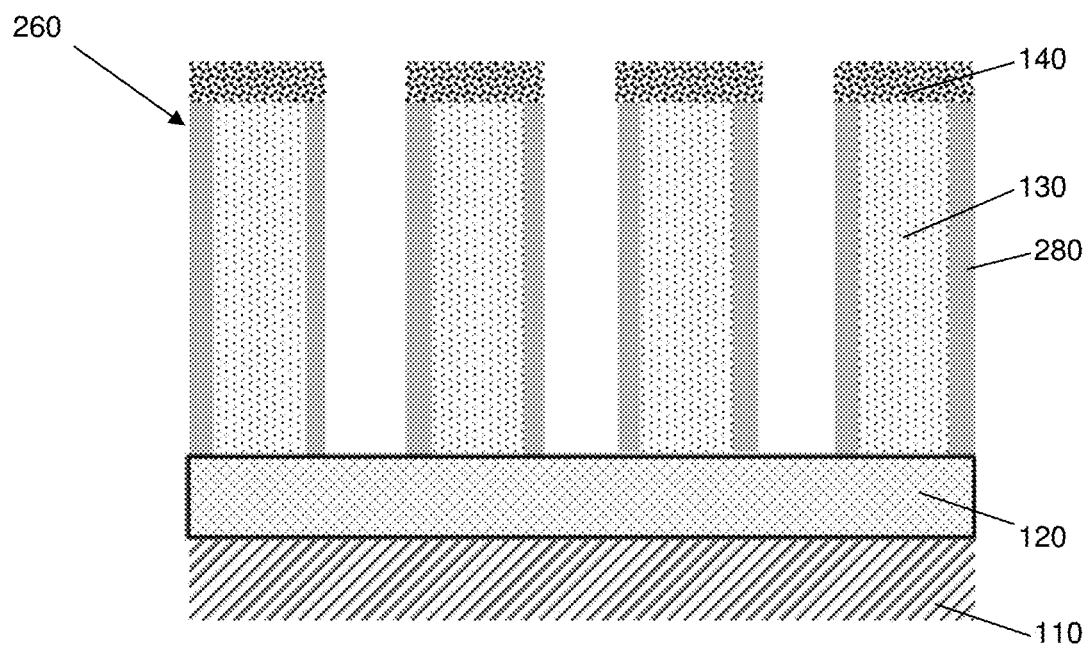
Figure 2C:
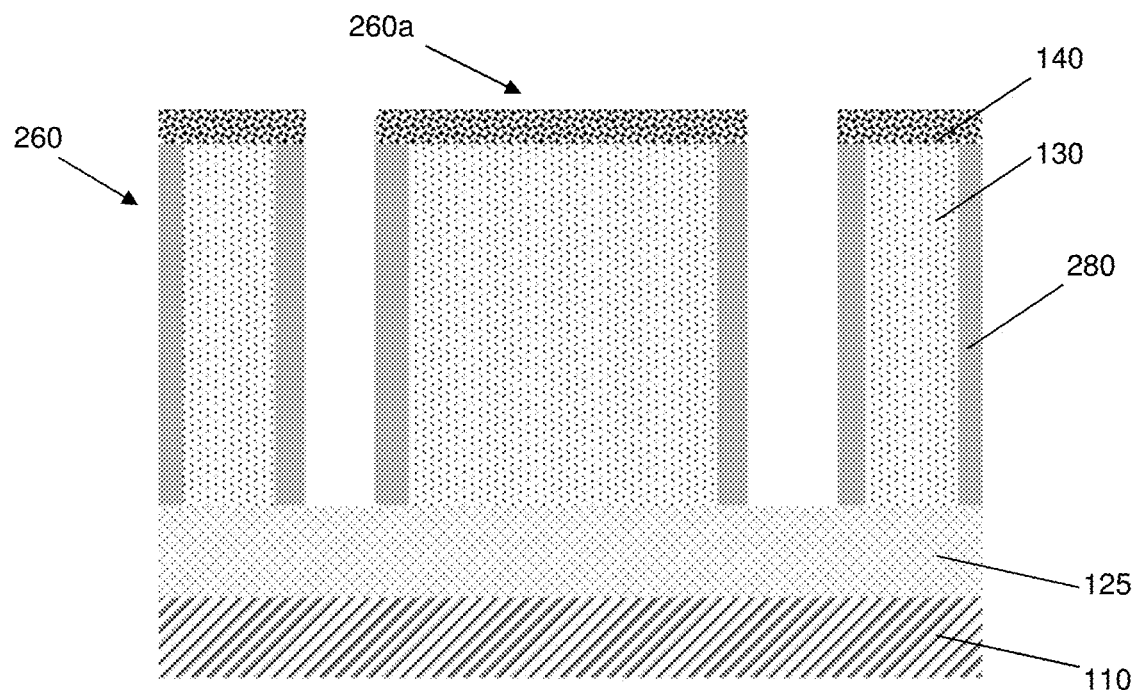
Figure 2D:
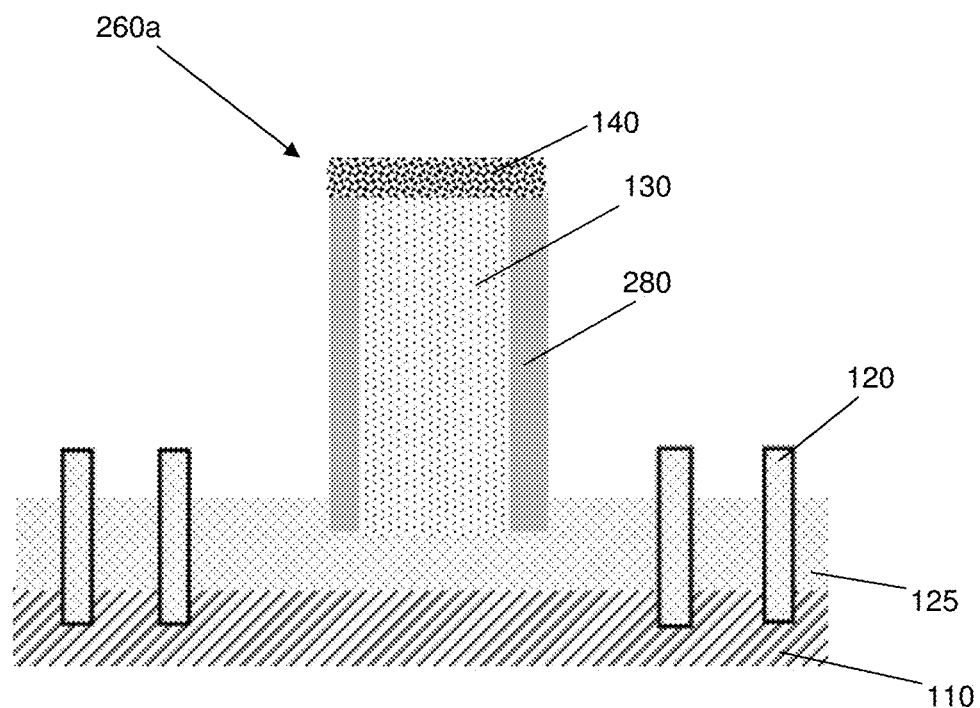

FIGS. 2A-2D illustrate the dummy gate structures 260, 260a. Specifically, FIG. 2A shows a top view of the dummy gate structures 260, 260a; whereas FIG. 2B shows a cross-sectional view in an X1-axis direction for the dummy gate structures 260, 260a. FIG. 2C shows a cross-sectional view in an X2-axis direction and FIG. 2D shows a cross-sectional view in a Y-axis direction for the dummy gate structures 260, 260a. FIGS. 2A-2D show sidewall spacers 280, e.g., a low-k dielectric, deposited on the sidewalls of the dummy gate structures 260, 260a, i.e., the poly Si material 130. The sidewall spacers 280 can be deposited by conventional CVD processes followed by a patterning process, e.g., anisotropic etching process, to remove any material from horizontal surfaces of the fin structures 120 and the poly Si material 130. FIGS. 2C and 2D show the insulator layer 125 which forms isolation regions (shallow trench isolation regions) adjacent to the dummy gate structures 260, 260a and between the fin structures 120.

Figure 3A:
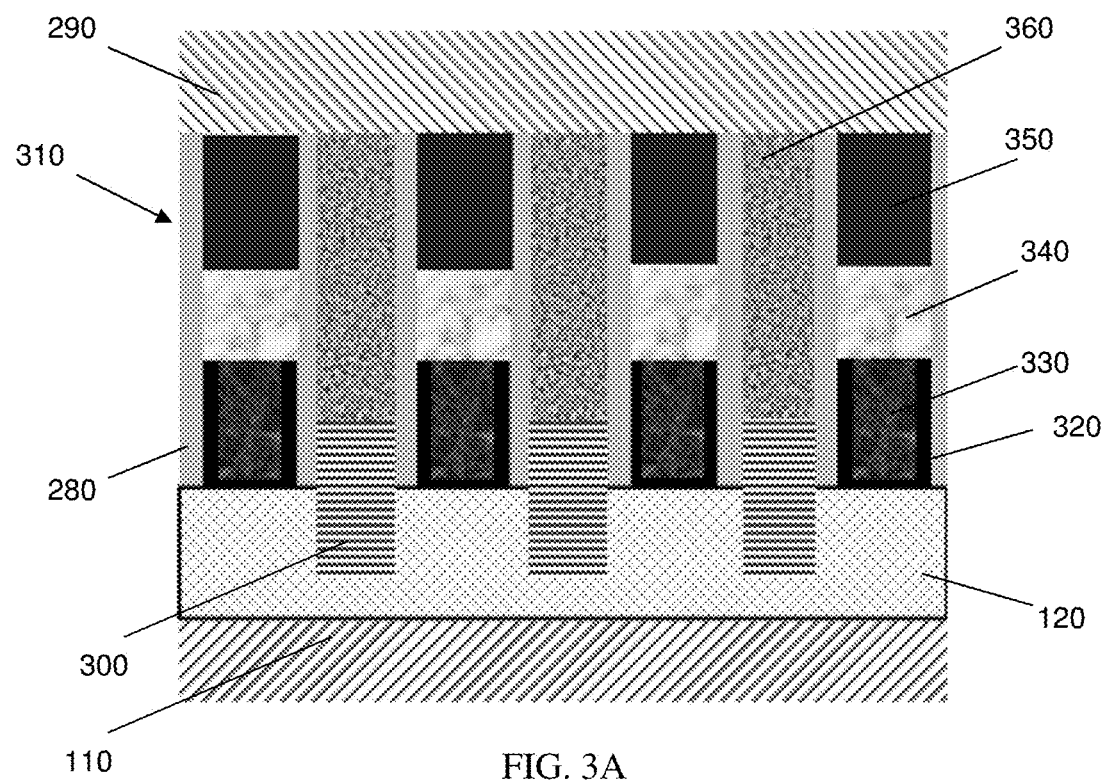
FIGS. 3A-3C show cross-sectional views of replacement gate structures, amongst other features, and respective fabrication processes in accordance with aspects of the present disclosure.
Figure 3B:
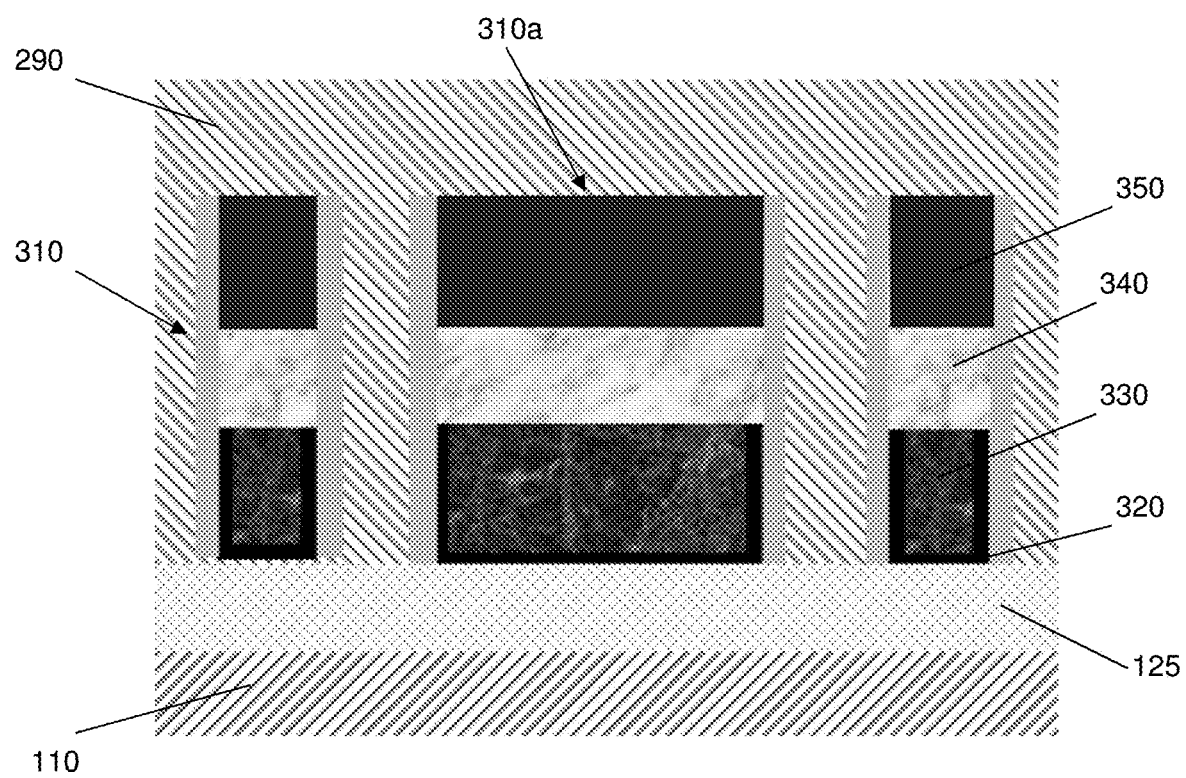
Figure 3C:
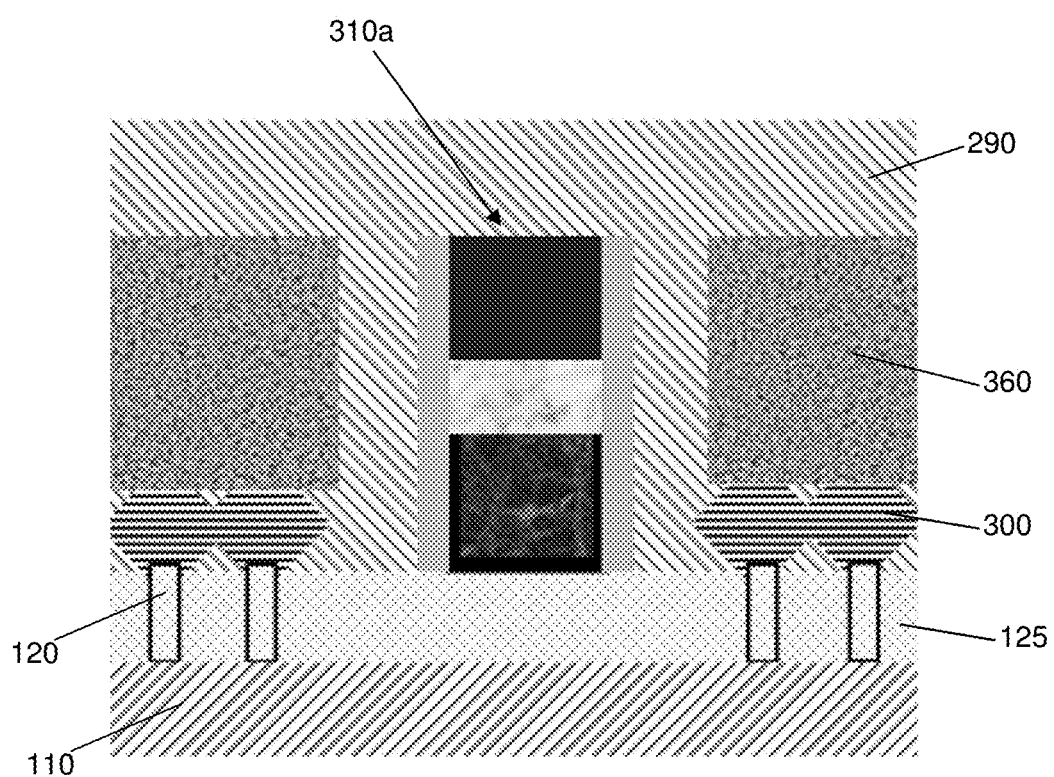

FIGS. 3A-3C show replacement gate structures 310, 310a in accordance with aspects of the disclosure. Referring to FIG. 3A, source and drain (S/D) regions 300 are formed on the sides of the gate structures 310, 310a in the substrate 110 of the fin structures 120 using, e.g., any conventional doping/ion implementation process. For example, the S/D regions 300 can be formed by an ion implantation process, doping process or through a diffusion process, as is well known to those of skill in the art such that no further explanation is required for an understanding of the present disclosure. In further embodiments, the S/D regions 300 can be raised S/D regions 300 formed by an epi growth on the surfaces of the substrate 110 between the dummy gate structures 260, 260a, as shown in FIGS. 3A and 3C.

Continuing with FIGS. 3A and 3B, the gate structures 310, 310a are formed in trenches, which are formed by the removal of the poly Si material 130 of the dummy gate structures 260, 260a, using conventional lithography and etching techniques, e.g., a RIE process. For example, an etching process will be used to remove the poly Si material 130 to form one or more trenches between the sidewall spacers 280. Gate structures 310, 310a are formed within the trenches on the fin structures 120 by replacement gate fabrication processes. Similar to the dummy gate structures 260, the gate structures 310 can have a width in a range of about 5 nm to 40 nm, or a width in a range of about 80 nm to 250 nm, amongst other examples.

In FIGS. 3A-3C, the gate structures 310, 310a include a gate dielectric 320 and metallization features 330, 340. The gate dielectric 320 can be, e.g., a high-k gate dielectric material, e.g., hafnium-based dielectrics. In further embodiments, the high-k dielectric materials can include, but are not limited to: $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

The gate metallization feature, i.e., workfunction metal 330, can include any workfunction metal or any combination of metals, depending on the particular application and design parameters. For example, in embodiments, the workfunction metal 330 can be a tungsten (W) material. The remaining metallization feature, i.e., gate metal 340, can include any conductive material, e.g., TiN, TaN, amongst other examples. A capping material 350 is deposited over the gate dielectric 320 and the gate metallization features 330, 340, by CVD processes, followed by a CMP process. Accordingly, the plurality of adjacent gate structures 310 are finFET gate structures.

Referring to FIG. 3B, the gate structures 310 comprise adjacent gate structures 310 which are bridged together by a gate connection. Specifically, the poly Si material 130 of the bridged dummy gate structure 260a is replaced with the gate materials 320, 330, 340. Further, the connection established by the dummy gate connection 270 of FIG. 2A remains during the replacement gate process. In this way, during the replacement gate process, the replacement gate structure is a bridged gate structure 310a because of the previous gate connection established by dummy gate connection 270.

In embodiments, the gate materials 320, 330, 340 will be shared between the adjacent gate structures 310 in the bridged gate structure 310a. In this way, the bridged gate structure 310a comprises a bridge between two adjacent gate structures 310, comprised of a conductive gate material, i.e., workfunction metal 330 and gate metal 340. Specifically, the bridge structure provides electrical contact between gate material of the two or more gate structures. More specifically, the bridge structure, i.e., bridged gate structure 310a, comprises a gate dielectric 320, a workfunction metal 330 and a gate metal 340. Advantageously, the bridged gate structure 310a allows for a relatively significant reduction for a subsequent gate contact. In this way, a middle of line (MOL) multi-finger (multi-fin) device with a single gate contact can be achieved with an increased process of margin.

FIGS. 3A-3C further show source/drain (S/D) metallization features 360 formed in contact with the S/D regions 300. In embodiments, a silicide liner is deposited over the S/D regions 300 which is then subjected to a silicide process. Following the silicide process, a metal material is deposited on the silicide liner, thereby forming the source/drain metallization features 360. In embodiments, the metal material can be composed of cobalt (Co), tungsten (W) or Ruthenium (Ru), for example. In further embodiments, there could be a thin metal liner material deposited before deposition metal of the metal material, e.g. TiN, TaN.

Referring still to FIGS. 3A-3C, a dielectric layer 290 is deposited over and between the gate structures 310, 310a. In embodiments, the dielectric layer 290 is deposited within trenches between the gate structures 310, 310a by CVD processes. The dielectric layer 290 is an interlevel dielectric material, preferably composed of oxide. The deposition of the dielectric layer 290 is followed by a chemical mechanical planarization (CMP) process. In embodiments, the bridge gate structure 310a is an H-shape. In further embodiments, the bridged gate structure 310a can be other bridged shapes, e.g., U-shaped.

FIGS. 4A-4D show S/D contacts 370 and gate contact 380. In embodiments, the S/D contacts 370 and gate contact 380 can be formed together or sequentially. Fabrication of the S/D contacts 370 and gate contact 380 includes forming a resist over the dielectric layer 290, which is exposed to energy (light) to form a pattern (opening). An etching process with a selective chemistry, e.g., RIE, will be used to form one or more trenches in the dielectric layer 290 and the capping material 350 through the openings of the resist.

In embodiments, the resist can be removed by a conventional oxygen ashing process or other known stripants, followed by the deposition of a conductive material by conventional deposition processes, e.g., CVD processes, to form the S/D contacts 370 and gate contact 380. Any residual conductive material on the surface of the dielectric layer 290 can be removed by conventional chemical mechanical polishing (CMP) processes. The S/D contacts 370 are formed directly on the source and drain metallization features 360, while gate contact 380 is formed directly on the gate materials 320, 330, 340 of the gate structures 310.

In embodiments, the gate contact 380 is a reduced gate contact, which allows for scaling in MOL structures and also for enlargement of an MOL process margin without any concern for shorting to occur between the gate structure and the S/D metallization features 360. Specifically, the bridged gate structure 310a includes a gate connection 270a so that the bridged gate structure 310a is formed on the plurality of adjacent gate structures 310 and the bridged gate structure 310a. The gate connection 270a allows for the gate contact 380 to be in electrical contact with more than one gate structure 310 will still having a reduced size.

In embodiments, the gate contact 380 to the bridged gate structure 310a is positioned within the gate connection 270a and in electrical contact with the plurality of adjacent gate structures 310. In this way, a plurality of gate structures 310 comprising source/drain regions 300, gate materials 320, 330, 340, sidewall spacers 280 and a capping material 350 on the gate materials 320, 330, 340, is provided herein. A bridge structure, i.e., bridged gate structure 310a, spans between two or more gate structures 310 of the plurality of gate structures 310, and a plurality of source and drain metallization features 360 are in electrical contact with the source/drain regions 300. Additionally, a contact, i.e., gate contact 380, is on the bridge structure. In embodiments, a fill material of the source and drain metallization features 360 is below the contact, i.e., gate contact 380.

In further embodiments, the structures and processes described herein provide for a plurality of adjacent gate structures 310, and a bridged gate structure 310a composed of a plurality of the adjacent gate structures 310. Further, there are source and drain regions 300 adjacent to the bridged gate structure 310a and comprising source and drain metallization features 360. Additionally, the structures and processes described herein provide for contacts 370, 380 to the bridged gate structure 310a and the source and drain metallization features 360.

Figure 4A:
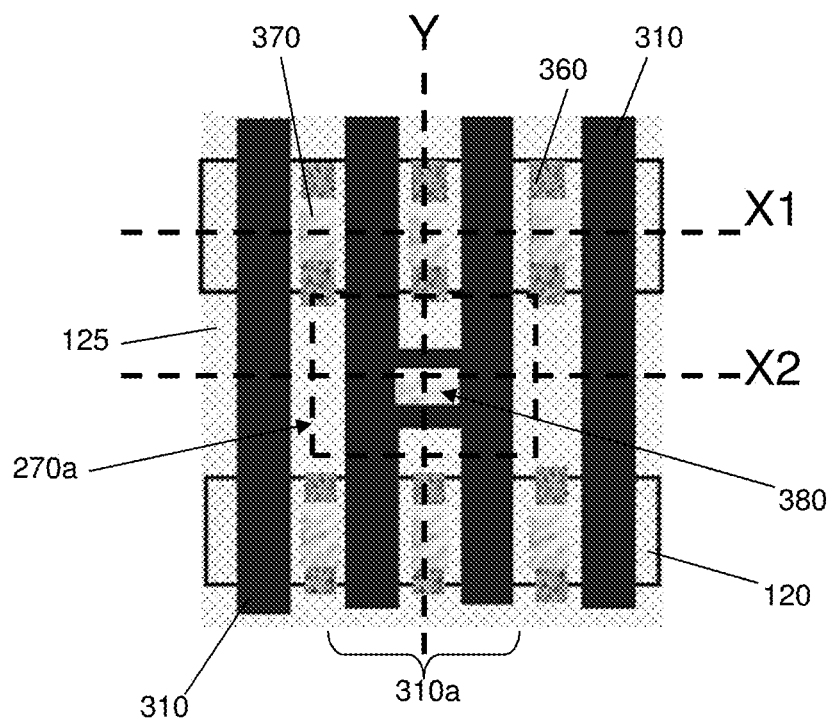
FIGS. 4A-4D show cross-sectional views of source/drain and gate contacts, amongst other features, and respective fabrication processes in accordance with aspects of the present disclosure.
Figure 4B:
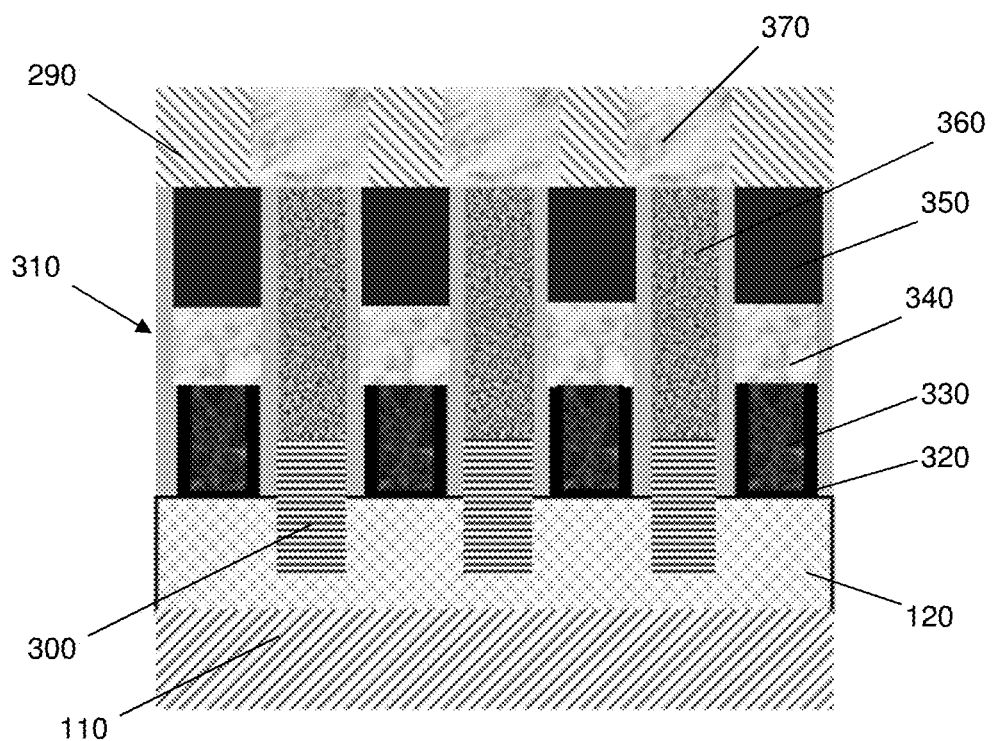
Figure 4C:
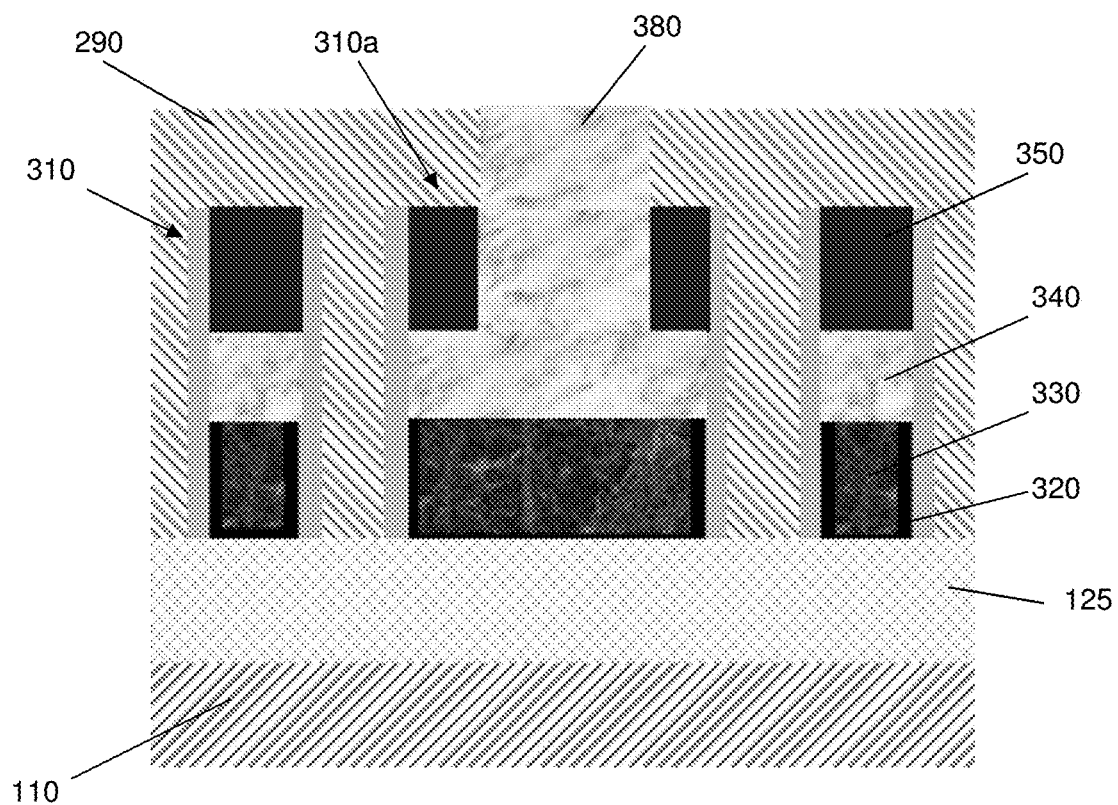
Figure 4D:
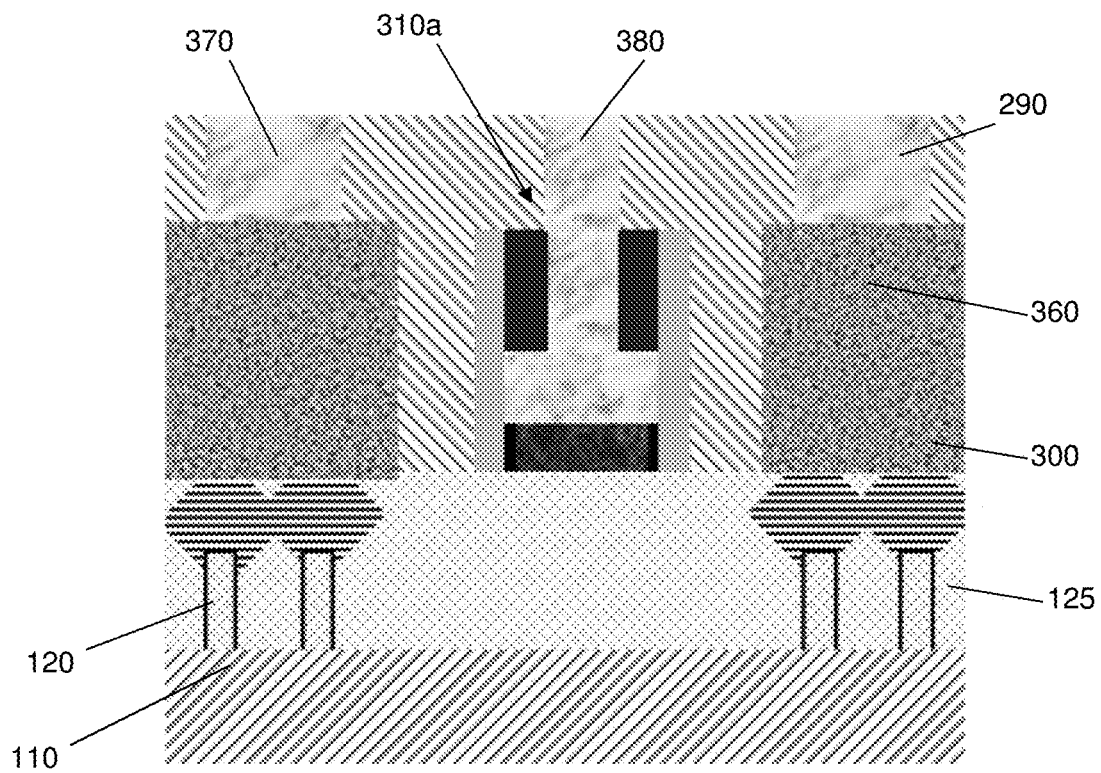
Figure 5A:
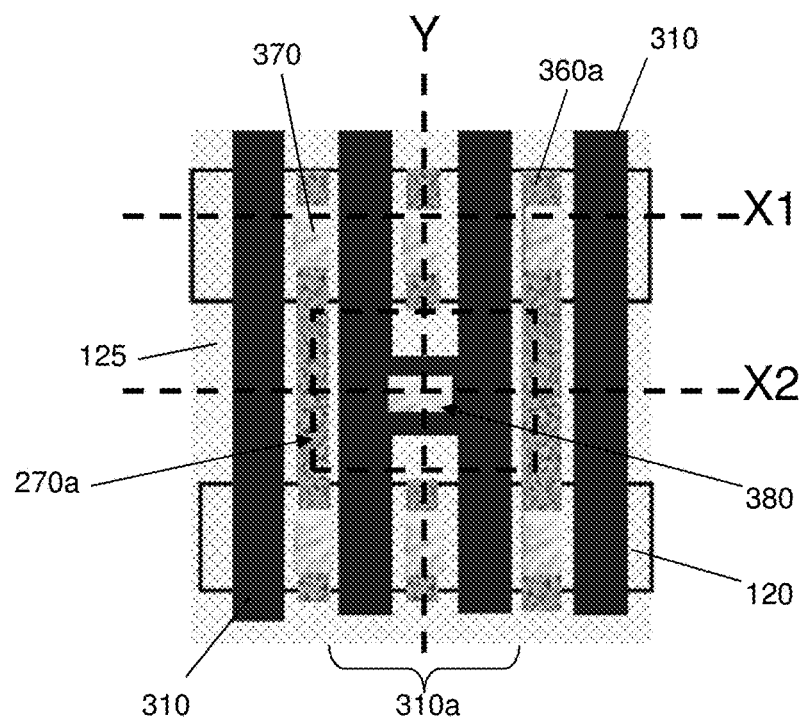
FIGS. 5A and 5B show respective structures and fabrication processes in accordance with alternative aspects of the present disclosure.
Figure 5B:
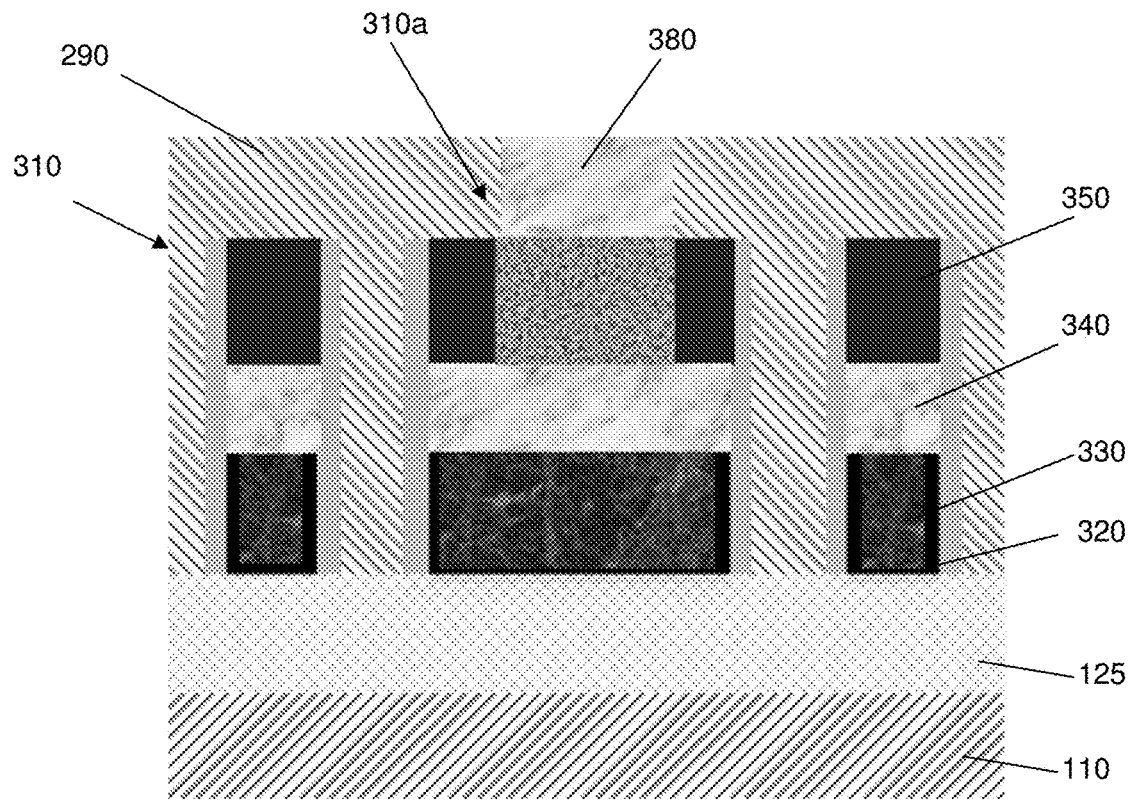

FIGS. 5A and 5B show alternative structures and fabrication processes in accordance with the present disclosure. Specifically, FIG. 5A shows a top view of a structure having alternative (S/D) metallization features 360a. More specifically, by having a single gate contact 380 in contact with more than one gate structure 310, S/D metallization features 360 have greater flexibility with respect to sizes, shapes and placement. For example, FIG. 4A shows separate S/D metallization features 360 on each fin structure 120; whereas FIG. 5A shows a single S/D metallization feature 360a spanning the fin structures 120. In this way, the source and drain metallization features 360 extend across fin structures 120 of the finFET gate structures, i.e., gate structures 310. Accordingly, the contacts, i.e., S/D contacts 370, to the source and drain metallization features 360a which extend to opposing fins 120. In this way, the source and drain metallization features 360a extend alongside the contact, i.e., gate contact 380.

This flexibility with respect to the S/D metallization features 360a allows for a reduction in process steps and materials, i.e., less patterning steps, along with an increase in the process margin because of the elimination of a risk for shorting between the gate contact and the S/D metallization features provided by the bridged gate structure 310a. FIG. 5B shows a cross-sectional view along X2-axis direction, with the same metal fill used for the S/D metallization features 360a being deposited directly on the gate metallization features 330, 340, as opposed to FIG. 4C where the gate contact 380 is in direct electrical contact with the gate metallization features 330, 340. The gate connection 270a allows for the gate contact 380 to be in electrical contact with more than one gate structure 310 will still having a reduced size.

Accordingly, the structures and processes described herein provide for a method with the steps of: forming a plurality of gate structures 310; bridging the gate structures 310 to form a bridged gate structure 310a; and forming a contact, i.e., gate contact 380, to the bridged gate structure 310a. Additional steps include: forming source and drain regions 300; forming metallization features 360a to the source and drain regions 300 which extend alongside the contact, i.e., gate contact 380; and forming contacts 370 to the metallization features 360a by depositing a fill material simultaneously on the source and drain regions 300 and the bridged gate structure 310a, as illustrated in FIG. 5B. The bridging of the gate structures 310 comprises patterning a gate connection 190, 210, 240, 270 over dummy gate structures 160, 230, 260 through a plurality of underlying layers 130, 140, 150, 170.

It should now be understood that the processes and resultant structures described herein allow for the formation of a bridged (cladded) gate structure by bridging adjacent gate structures together. Advantageously, the cladded gate structure allows for a relatively significant reduction in gate contact sizing. In this way, a middle of line (MOL) multi-finger (multi-fin) device with a single gate contact can be achieved. Additionally, the reduced gate contact of the bridged gate structure allows for scaling in MOL structures and also for enlargement of an MOL process margin. In addition, the reduced gate contact allows for adjacent S/D metallization features to have greater flexibility with respect to sizes, shapes and placement, e.g., a single S/D metallization feature spanning the fin structures. This flexibility with respect to the S/D metallization features allows for a reduction in process steps and materials, i.e., less patterning steps, along with an increase in the process margin because of the elimination of a risk for shorting between the gate contact and the S/D metallization features provided by the bridged gate structure.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure, comprising:
a first gate structure and a second gate structure separated from each other by a bridged gate structure, the bridged gate structure comprising a third gate structure and a fourth gate structure connected to one another by a gate connector, and the first gate structure and second gate structure being devoid of the gate connector;
source and drain regions adjacent to the bridged gate structure and comprising source and drain metallization features; and
contacts to the bridged gate structure and the source and drain metallization features.

2. The structure of claim 1, wherein the bridged gate structure is an H-shape.

3. The structure of claim 1, wherein the first, second, third and fourth gate structures are finFET gate structures.

4. The structure of claim 3, wherein the source and drain metallization features extend across fin structures of the finFET gate structures.

5. The structure of claim 1, wherein the contacts are formed on each of the first, second, third and fourth gate structures.

6. The structure of claim 1, wherein the gate connector is comprised of a conductive gate material.

7. The structure of claim 1, further comprising a fifth gate structure, wherein the second gate structure is located between the fifth gate structure and the bridged gate structure, and the fifth gate structure is wider than each of the first, second, third and fourth gate structures.

8. The structure of claim 7, further comprising a sixth gate structure, wherein the fifth gate structure is located between the sixth gate structure and the second gate structure, and wherein the sixth gate structure is wider than each of the first, second, third and fourth gate structures.

9. The structure of claim 8, wherein the width of each of the fifth and sixth gate structures is between 80 nm-250 nm and the width of each of the first to fourth gate structures is between 5 nm-40 nm.

10. A structure, comprising:
    first, second, third and fourth gate structures, each comprising source/drain regions, gate materials, sidewall spacers and a capping material on the gate materials;
    a bridge gate structure comprising the third and fourth gate structures, the bridge gate structure located between the first gate structure and the second gate structure, the bridged gate structure comprising a gate connector located in middle portions of the third gate structure and the fourth gate structure connecting the third gate structure and the fourth gate structure to one another, and the first and second gate structures being devoid of the gate connector;
    a plurality of source and drain metallization features in electrical contact with the source/drain regions; and
    a contact on the bridge gate structure.

11. The structure of claim 10, wherein the bridge structure provides electrical contact between gate material of the third and fourth gate structures.

12. The structure of claim 10, wherein the first, second, third and fourth gate structures each comprises a gate dielectric, a workfunction metal and a gate metal.

13. The structure of claim 10, wherein the contact is directly on the gate material of the third and fourth gate structures.

14. The structure of claim 10, wherein the source and drain metallization features extend alongside the contact.

15. The structure of claim 10, wherein the first, second, third and fourth gate structures are finFET gate structures.

16. The structure of claim 15, wherein the source and drain metallization features extend to opposing fins of the finFET gate structures.

17. The structure of claim 16, further comprising contacts to the source and drain metallization features which extend to opposing fins.

18. The structure of claim 17, wherein a fill material of the source and drain metallization features is below the contact.

19. A method, comprising:
    forming first, second, third and fourth gate structures, each comprising source/drain regions, gate materials, sidewall spacers and a capping material on the gate materials;
    forming a bridge gate structure comprising the third gate structure and the fourth gate structure, the bridge gate structure located between the first gate structure and the second gate structure, the bridged gate structure comprising a gate connector connecting the third gate structure and the fourth gate structure, and the first and second gate structures being devoid of the gate connector
    forming a plurality of source and drain metallization features in electrical contact with the source/drain regions; and
    forming a contact on the bridge gate structure.

* * * * *